(12) United States Patent
Baliga

(10) Patent No.: US 6,545,316 B1
(45) Date of Patent: Apr. 8, 2003

(54) MOSFET DEVICES HAVING LINEAR TRANSFER CHARACTERISTICS WHEN OPERATING IN VELOCITY SATURATION MODE AND METHODS OF FORMING AND OPERATING SAME

(75) Inventor: Bantval Jayant Baliga, Raleigh, NC (US)

(73) Assignee: Silicon Wireless Corporation, Research Triangle Park, NC (US)

(*) Notice: Subject to any disclaimer, the term of this patent is extended or adjusted under 35 U.S.C. 154(b) by 1 day.

(21) Appl. No.: 09/602,414

(22) Filed: Jun. 23, 2000

(51) Int. Cl.$^7$ ............................................... H01L 29/76
(52) U.S. Cl. ..................... 257/329; 257/330; 257/333; 257/339; 257/342
(58) Field of Search ................................ 257/327–335, 257/341–343, 133, 139–141; 438/268–274

(56) References Cited

U.S. PATENT DOCUMENTS

| | | | |
|---|---|---|---|
| 4,376,286 A | 3/1983 | Lidow et al. ................. | 357/23 |
| 4,419,811 A | 12/1983 | Rice ........................... | 29/571 |
| 4,590,509 A | 5/1986 | Esser et al. .................. | 357/53 |
| 4,593,302 A | 6/1986 | Lidow et al. ................. | 357/23.4 |
| 4,680,853 A | 7/1987 | Lidow et al. ................. | 29/571 |
| 4,705,759 A | 11/1987 | Lidow et al. ................. | 437/29 |
| 4,789,882 A | 12/1988 | Lidow ......................... | 357/23.4 |
| 4,904,614 A | 2/1990 | Fisher et al. ................. | 437/41 |
| 4,941,026 A | 7/1990 | Temple ....................... | 357/23.4 |
| 4,959,699 A | 9/1990 | Lidow et al. ................. | 357/23.7 |
| 4,975,751 A | 12/1990 | Beasom ....................... | 357/13 |
| 5,008,725 A | 4/1991 | Lidow et al. ................. | 357/23.4 |
| 5,016,066 A * | 5/1991 | Takahashi ..................... | 357/23.4 |
| 5,113,236 A | 5/1992 | Arnold et al. ................ | 357/41 |
| 5,191,396 A | 3/1993 | Lidow et al. ................. | 257/339 |
| 5,213,986 A | 5/1993 | Pinker et al. ................. | 437/20 |
| 5,216,807 A | 6/1993 | Yoshizawa et al. ........... | 29/876 |

(List continued on next page.)

FOREIGN PATENT DOCUMENTS

| | | | |
|---|---|---|---|
| DE | 195 34 154 A1 | 3/1997 | ......... H01L/29/808 |
| JP | 63-296282 | 2/1988 | |
| WO | WO 99/56311 | 11/1999 | |

OTHER PUBLICATIONS

Merchant et al., "Realization of High Breakdown Voltage (>700 V) in This SOI Devices," Philips Laboratories, North American Philips Corporation, 1991 IEEE, pp. 31–35.

Merchant et al., "Dependence of Breakdown Voltage on Drift Length and Buried Oxide Thickness in SOI RESURF LDMOS Transistors," 5$^{th}$ International Symposium on Power Semiconductor Devices and Ics, 1993 IEEE, pp. 124–128.

Sunkavalli et al., "Step Drift Doping Profile for High voltage DI Lateral Power Devices," Proceedings 1995 IEEE International SOI Conference, Oct. 1995, pp. 139–140.

Yamaguchi, Ken, "Field–Dependent Mobility Model for Two–Dimensional Numerical Analysis of MOSFET's," IEEE Transactions on Electron Devices, vol. ED–26, No. 7, Jul. 1979, pp. 1068–1074.

*Primary Examiner*—Tom Thomas
*Assistant Examiner*—Ori Nadav
(74) *Attorney, Agent, or Firm*—Myers Bigel Sibley & Sajovec

(57) ABSTRACT

MOSFET embodiments of the present invention provide highly linear transfer characteristics (e.g., $I_d$ v. $V_g$) and can be used effectively in linear power amplifiers. These linear transfer characteristics are provided by a MOSFET having a channel that operates in a linear mode and a drift region that simultaneously supports large voltages and operates in a current saturation mode. A relatively highly doped transition region is preferably provided between the channel region and the drift region. Upon depletion, this transition region provides a potential barrier that supports separate and simultaneous linear and current saturation modes.

5 Claims, 12 Drawing Sheets

U.S. PATENT DOCUMENTS

| | | | |
|---|---|---|---|
| 5,229,633 A | 7/1993 | Fisher et al. | 257/339 |
| 5,246,870 A | 9/1993 | Merchant | 437/21 |
| 5,283,201 A | 2/1994 | Tsang et al. | 437/31 |
| 5,300,448 A | 4/1994 | Merchant et al. | 437/41 |
| 5,338,961 A | 8/1994 | Lidow et al. | 257/342 |
| 5,350,932 A | 9/1994 | Malhi | 257/67 |
| 5,362,979 A | 11/1994 | Merchant | 257/340 |
| 5,391,908 A | 2/1995 | Walker et al. | 257/409 |
| 5,412,241 A | 5/1995 | Merchant | 257/409 |
| 5,445,978 A | 8/1995 | Yilmaz | 437/41 |
| 5,545,908 A * | 8/1996 | Tokura et al. | 257/341 |
| 5,578,508 A | 11/1996 | Baba et al. | 437/35 |
| 5,623,152 A * | 4/1997 | Majumdar et al. | 257/330 |
| 5,640,034 A | 6/1997 | Malhi | 257/341 |
| 5,648,671 A | 7/1997 | Merchant | 257/347 |
| 5,672,526 A | 9/1997 | Kawamura | 437/41 R |
| 5,701,026 A | 12/1997 | Fujishima et al. | 257/510 |
| 5,710,451 A | 1/1998 | Merchant | 257/347 |
| 5,710,455 A | 1/1998 | Bhatnagar et al. | 257/472 |
| 5,767,547 A | 6/1998 | Merchant et al. | 257/347 |
| 5,844,275 A | 12/1998 | Kitamura et al. | 257/335 |
| 5,885,878 A | 3/1999 | Fujishima et al. | 438/302 |
| 5,918,137 A | 6/1999 | Ng et al. | 438/454 |
| 5,973,360 A * | 10/1999 | Tihanyi | 257/330 |
| 5,998,833 A | 12/1999 | Baliga | 257/329 |

* cited by examiner

MOSFET DEVICES HAVING LINEAR TRANSFER CHARACTERISTICS WHEN OPERATING IN VELOCITY SATURATION MODE AND METHODS OF FORMING AND OPERATING SAME

FIELD OF THE INVENTION

The present invention relates to semiconductor switching devices, and more particularly to switching devices for power switching and power amplification applications.

BACKGROUND OF THE INVENTION

Power MOSFETs have typically been developed for applications requiring power switching and power amplification. For power switching applications, the commercially available devices are typically DMOSFETs and UMOSFETs. In these devices, one main objective is obtaining a low specific on-resistance to reduce power losses. In a power MOSFET, the gate electrode provides turn-on and turn-off control upon the application of an appropriate gate bias. For example, turn-on in an N-type enhancement MOSFET occurs when a conductive N-type inversion-layer channel (also referred to as "channel region") is formed in the P-type base region in response to the application of a positive gate bias. The inversion-layer channel electrically connects the N-type source and drain regions and allows for majority carrier conduction therebetween.

The power MOSFET's gate electrode is separated from the base region by an intervening insulating layer, typically silicon dioxide. Because the gate is insulated from the base region, little if any gate current is required to maintain the MOSFET in a conductive state or to switch the MOSFET from an on-state to an off-state or vice-versa. The gate current is kept small during switching because the gate forms a capacitor with the MOSFET's base region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carrier transport through an inversion-layer channel, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop across power MOSFETs increases with increasing temperature, thereby promoting an even current distribution in parallel connected devices.

DMOSFETs and UMOSFETs are more fully described in a textbook by B. J. Baliga entitled *Power Semiconductor Devices*, PWS Publishing Co. (ISBN 0-534-94098-6) (1995), the disclosure of which is hereby incorporated herein by reference. Chapter 7 of this textbook describes power MOSFETs at pages 335–425. Examples of silicon power MOSFETs including accumulation, inversion and extended trench FETs having trench gate electrodes extending into the N+ drain region are also disclosed in an article by T. Syau, P. Venkatraman and B. J. Baliga, entitled *Comparison of Ultralow Specific On-Resistance UMOSFET Structures: The ACCUFET, EXTFET, INVFET, and Convention UMOSFETS*, IEEE Transactions on Electron Devices, Vol. 41, No. 5, May (1994). As described by Syau et al., specific on-resistances in the range of 100–250 $\mu\Omega cm^2$ were experimentally demonstrated for devices capable of supporting a maximum of 25 volts. However, the performance of these devices was limited by the fact that the forward blocking voltage must be supported across the gate oxide at the bottom of the trench.

FIG. 1, which is a reproduction of FIG. 1 (*d*) from the aforementioned Syau et al. article, discloses a conventional UMOSFET structure. In the blocking mode of operation, this UMOSFET supports most of the forward blocking voltage across the N-type drift layer which must be doped at relatively low levels to obtain a high maximum blocking voltage capability, however low doping levels typically increase the on-state series resistance. Based on these competing design requirements of high blocking voltage and low on-state resistance, a fundamental figure of merit for power devices has been derived which relates specific on-resistance ($R_{on,sp}$) to the maximum blocking voltage (BV). As explained at page 373 of the aforementioned textbook to B. J. Baliga, the ideal specific on-resistance for an N-type silicon drift region is given by the following relation:

$$R_{on,sp}=5.93\times10^{-9}(BV)^{2.5} \tag{1}$$

Thus, for a device with 60 volt blocking capability, the ideal specific on-resistance is 170 $\mu\Omega cm^2$. However, because of the additional resistance contribution from the channel, reported specific on-resistances for UMOSFETs are typically much higher. For example, a UMOSFET having a specific on-resistance of 730 $\mu\Omega cm^2$ is disclosed in an article by H. Chang, entitled *Numerical and Experimental Comparison of 60V Vertical Double-Diffused MOSFETs and MOSFETs With A Trench-Gate Structure*, Solid-State Electronics, Vol. 32, No. 3, pp. 247–251, (1989). However, in this device a lower-than-ideal uniform doping concentration in the drift region was required to compensate for the high concentration of field lines near the bottom corner of the trench when blocking high forward voltages. U.S. Pat. Nos. 5,637,989 and 5,742,076 and U.S. Application Ser. No. 08/906,916, filed Aug. 6, 1997, the disclosures of which are hereby incorporated herein by reference, also disclose popular power semiconductor devices having vertical current carrying capability.

In particular, U.S. Pat. No. 5,637,898 to Baliga discloses a preferred silicon field effect transistor which is commonly referred to as a graded-doped (GD) UMOSFET. As illustrated by FIG. 2, which is a reproduction of FIG. 3 from the '898 patent, a unit cell 100 of an integrated power semiconductor device field effect transistor may have a width "$W_c$" of 1 $\mu m$ and comprise a highly doped drain layer 114 of first conductivity type (e.g., N+) substrate, a drift layer 112 of first conductivity type having a linearly graded doping concentration therein, a relatively thin base layer 116 of second conductivity type (e.g., P-type) and a highly doped source layer 118 of first conductivity type (e.g., N+). The drift layer 112 may be formed by epitaxially growing an N-type in-situ doped monocrystalline silicon layer having a thickness of 4 $\mu m$ on an N-type drain layer 114 having a thickness of 100 $\mu m$ and a doping concentration of greater than $1\times10^{18}$ cm$^{-3}$ (e.g. $1\times10^{19}$ cm$^{-3}$) therein. The drift layer 112 also has a linearly graded doping concentration therein with a maximum concentration of $3\times10^{17}$ cm$^{-3}$ at the N+/N junction with the drain layer 114, and a minimum concentration of $1\times10^{16}$ cm$^{-3}$ beginning at a distance 3 $\mu m$ from the N+/N junction (i.e., at a depth of 1 μm) and continuing at a uniform level to the upper face. The base layer 116 may be formed by implanting a P-type dopant such as boron into the drift layer 112 at an energy of 100 kEV and at a dose level of $1\times10^{14}$ cm$^{-2}$. The P-type dopant may then be diffused to a depth of 0.5 μm into the drift layer 112. An N-type dopant such as arsenic may also be implanted at an energy of 50 kEV and at dose level of $1\times10^{15}$ cm$^{-2}$. The N-type and P-type dopants can then be diffused simultaneously to a depth of 0.5 μm and 1.0 μm, respectively, to form a composite semiconductor substrate containing the drain, drift, base and source layers.

A stripe-shaped trench having a pair of opposing sidewalls 120a which extend in a third dimension (not shown) and a bottom 120b is then formed in the substrate. For a unit cell 100 having a width $W_c$ of 1 μm, the trench is preferably formed to have a width "$W_t$" of 0.5 μm at the end of processing. An insulated gate electrode, comprising a gate insulating region 124 and an electrically conductive gate 126 (e.g., polysilicon), is then formed in the trench. The portion of the gate insulating region 124 extending adjacent the trench bottom 120b and the drift layer 112 may have a thickness "$T_1$" of about 2000 Å to inhibit the occurrence of high electric fields at the bottom of the trench and to provide a substantially uniform potential gradient along the trench sidewalls 120a. The portion of the gate insulating region 124 extending opposite the base layer 116 and the source layer 118 may have a thickness "$T_2$" of about 500 Å to maintain the threshold voltage of the device at about 2–3 volts. Simulations of the unit cell 100 at a gate bias of 15 Volts confirm that a vertical silicon field effect transistor having a maximum blocking voltage capability of 60 Volts and a specific on-resistance ($R_{sp,on}$) of 40 μΩcm$^2$, which is four (4) times smaller than the ideal specific on-resistance of 170 μΩcm$^2$ for a 60 volt power UMOSFET, can be achieved. Notwithstanding these excellent characteristics, the transistor of FIG. 2 may suffer from a relatively low high-frequency figure-of-merit (HFOM) if the overall gate-to-drain capacitance (CGD) is too large. Improper edge termination of the MOSFET may also prevent the maximum blocking voltage from being achieved. Additional UMOSFETs having graded drift regions and trench-based source electrodes are also disclosed in U.S. Pat. No. 5,998,833 to Baliga, the disclosure of which is hereby incorporated herein by reference.

Power MOSFETs may also be used in power amplification applications (e.g., audio or rf). In these applications the linearity of the transfer characteristic (e.g., $I_d$ v. $V_g$) becomes very important in order to minimize signal distortion. Commercially available devices that are used in these power amplification applications are typically the LDMOS and gallium arsenide MESFETs. However, as described below, power MOSFETs including LDMOS transistors, may have non-linear characteristics that can lead to signal distortion. The physics of current saturation in power MOSFETs is described in a textbook by S. M. Sze entitled "Physics of Semiconductor Devices, Section 8.2.2, pages 438–451 (1981). As described in this textbook, the MOSFET typically works in one of two modes. At low drain voltages (when compared with the gate voltage), the MOSFET operates in a linear mode where the relationship between $I_d$ and $V_g$ is substantially linear. Here, the transconductance ($g_m$) is also independent of $V_g$:

$$g_m=(Z/L)u_{ns}C_{ox}V_d \qquad (2)$$

where Z and L are the channel width and length, respectively, $u_{ns}$ is the channel mobility, $C_{ox}$ is the specific capacitance of the gate oxide, and $V_d$ is the drain voltage. However, once the drain voltage increases and becomes comparable to the gate voltage ($V_g$), the MOSFET operates in the saturation mode as a result of channel pinch-off. When this occurs, the expression for transconductance can be expressed as:

$$g_m=(Z/L)u_{ns}C_{ox}(V_g-V_{th}) \qquad (3)$$

where $V_g$ represents the gate voltage and $V_{th}$ represents the threshold voltage of the MOSFET. Thus, as illustrated by equation (3), during saturation operation, the transconductance increases with increasing gate bias. This makes the relationship between the drain current (on the output side) and the gate voltage (on the input side) non-linear because the drain current increases as the square of the gate voltage. This non-linearity can lead to signal distortion in power amplifiers. In addition, once the voltage drop along the channel becomes large enough to produce a longitudinal electric field of more than about $1\times10^4$ V/cm while remaining below the gate voltage, the electrons in the channel move with reduced differential mobility because of carrier velocity saturation.

Thus, notwithstanding attempts to develop power MOSFETs for power switching and power amplification applications, there continues to be a need to develop power MOSFETs that can support high voltages and have improved electrical characteristics, including highly linear transfer characteristics when supporting high voltages.

SUMMARY OF THE INVENTION

MOSFET embodiments of the present invention provide highly linear transfer characteristics (e.g., $I_d$ v. $V_g$) and can be used effectively in linear power amplifiers, for example. Typical applications for linear power amplifiers include rf and audio applications. These preferred linear transfer characteristics may be achieved by forming a MOSFET device having an inversion-layer channel that operates in a linear mode while other regions within the device operate in a current saturation mode. In particular, the MOSFET device is configured so that the inversion-layer channel can be operated in a linear mode (without either channel pinch-off or velocity saturation in the channel) while a drift region of the MOSFET operates in a velocity saturation mode. A transition region of first conductivity type is also preferably provided between the channel and the drift region. This transition region is preferably relatively highly doped relative to at least a portion of the drift region. The doping concentration in the transition region is preferably set at a level sufficient to enable forward on-state conduction through the channel at low drain voltages and to maintain the channel in a linear mode of operation as the drain voltage is increased and exceeds the magnitude of a voltage applied to a gate electrode of the MOSFET. This linear mode of operation is frequently referred to as a triode mode of operation. When operated in the linear mode over a significant range of gate voltages, a constant transconductance value ($\delta i_d/\delta v_{gs}$) can be achieved over a greater dynamic range.

The design of the MOSFET is such that the transition region preferably becomes fully depleted before the voltage in the channel (at the end adjacent the transition region) equals the gate voltage. As used herein, the reference to the transition region being "fully depleted" should be interpreted to mean that the transition region is at least sufficiently depleted to provide a JFET-style pinch-off of a forward on-state current path that extends across the transition region. To achieve full depletion, a relatively highly doped region of second conductivity (e.g., P+) is provided in close proximity to the transition region and is electrically connected to a source region of the MOSFET. Accordingly, as the voltage in the channel increases the transition region becomes more and more depleted until a JFET-style pinch-off occurs within the transition region. This JFET-style pinch-off in the transition region can be designed to occur before the voltage at the drain-side of the channel ($V_{cd}$) equals the gate voltage (i.e., $V_{cd} \leq V_{gs}$). For example, the MOSFET may be designed so that the transition region becomes fully depleted when $0.1 \leq V_{cd} \leq 0.5$ Volts and $V_{gs} = 4.0$ Volts.

According to first embodiments of the present invention, an integrated power device is provided that comprises an insulated-gate field effect transistor having an inversion-layer channel therein that operates in a linear mode of operation during forward on-state conduction while a drain region of the transistor simultaneously operates in a velocity saturation mode of operation. Preferably, the transistor comprises a semiconductor substrate having a source region and drain contact region of first conductivity type therein. A base region of second conductivity type is also provided and this base region extends adjacent a surface of the semiconductor substrate. A transition region of first conductivity type is provided that extends to the surface and forms a rectifying junction with the base region. In addition, an insulated gate electrode extends on the surface and opposite the source, base and transition regions so that application of a gate bias of sufficient magnitude thereto induces formation of an inversion-layer channel. A drift region of first conductivity type is provided that extends between the transition region and the drain contact region. This drift region forms a first non-rectifying junction with the transition region and has a first conductivity type doping concentration therein on the drift region side of the first non-rectifying junction that is less than a first conductivity type doping concentration on the transition region side of the first non-rectifying junction.

These transistors also, preferably include means, adjacent the transition region, for fully depleting the transition region while the inversion-layer channel is operating in the linear mode. The means for fully depleting the transition region may comprise a buried region of second conductivity type disposed adjacent the transition region. This buried region preferably forms a non-rectifying junction with the base region and is electrically connected by the base region to a source contact. The means for fully depleting the transition region may also comprise a region of second conductivity type that is contiguous with the base region. A trench is also provided that extends in the semiconductor substrate and has a sidewall that defines an interface with the transition region. In addition, an insulated source electrode is provided in the trench and is electrically connected to the source region by the source contact.

According to second preferred embodiments of the present invention, UMOSFETs may be provided that comprise a semiconductor substrate having a source region and a drain contact region of first conductivity type therein and a trench in the substrate. An insulated gate electrode may also be provided in the trench. The trench also preferably comprises a buried source electrode that extends between the insulated gate electrode and a bottom of the trench. The buried source electrode and the source region are electrically connected together. A base region of second conductivity type is also provided in the semiconductor substrate. This base region extends to a sidewall of the trench so that application of a gate bias of sufficient magnitude to the insulated gate electrode induces formation of an inversion-layer channel in the base region. A drift region of first conductivity type is provided that extends to the sidewall of the trench and opposite the buried source electrode. During operation, this drift region operates in a velocity saturation mode. To provide isolation and improve performance by enabling linear and velocity saturation operation modes in the channel and drift region, respectively, a transition region is provided that extends between the drift region and the base region. This transition region forms non-rectifying and rectifying junctions with the drift region and base region, respectively. The transition region also has a higher first conductivity type doping concentration therein relative to a first conductivity type doping concentration in a portion of the drift region extending adjacent the non-rectifying junction. The UMOSFET may also constitute a GD-UMOSFET by doping the drift region so that it has a graded doping profile therein that increases in a direction extending from the non-rectifying junction to the drain region. The doping profile and shape of the base region may also be tailored so that the transition region become fully depleted as the voltage in the channel becomes close to the gate voltage.

According to third embodiments of the present invention, vertical MOSFETs may be provided that comprise a semiconductor substrate and a trench in the semiconductor substrate. A source electrode is also provided in the trench. This source electrode is separated from the sidewalls and bottom of the trench by an electrically insulating layer. An insulated gate electrode is also provided on a face of the semiconductor substrate and a base region of second conductivity type is provided in the semiconductor substrate. The base region extends opposite the insulated gate electrode. Preferred vertical MOSFETs also comprises a source region of first conductivity type that extends in the base region and forms a P-N rectifying junction therewith. To improve the device characteristics, the source region is electrically connected to the insulated source electrode. A transition region of first conductivity type is also utilized to provide isolation between the channel of the MOSFET and a drift region. This transition region extends from a sidewall of the trench to the base region and forms a P-N junction therewith so that application of a gate bias of sufficient magnitude to the insulated gate electrode induces formation of an inversion-layer channel that extends from the source region to the transition region. A drift region is also provided in the semiconductor substrate and this drift region extends adjacent the sidewall of the trench. This drift region forms a non-rectifying junction with the transition region at a location where a first conductivity type doping concentration in the drift region is less than a first conductivity type doping concentration in the transition region. In particular, a maximum first conductivity type doping concentration in the transition region is greater than about ten times a first conductivity type doping concentration in the drift region at the location of the non-rectifying junction.

According to fourth embodiments of the present invention, lateral MOSFETs may be provided that comprise a semiconductor substrate having an epitaxial region of first conductivity type therein extending to a face thereof and a base region of second conductivity type in the epitaxial region. A source region of first conductivity type also extends in the base region and forms a respective P-N junction therewith. In contrast, a drain contact region is provided in the epitaxial region, but is spaced from the base region. An insulated gate electrode is also provided on the face of the substrate. This gate electrode extends opposite the base region. A preferred transition region is also provided that extends in the semiconductor substrate and forms a P-N junction with the base region. The positioning of the transition region is such that the application of a gate bias of sufficient magnitude to the insulated gate electrode induces formation of an inversion-layer channel in the base region that extends from the source region to the transition region. A drift region of first conductivity type is also provided that operates in a velocity saturation mode during on-state operation. This drift region extends between the transition region and the drain contact region and forms first and second non-rectifying junctions therewith, respectively. A minimum first conductivity type doping concentration in the drift region is preferably less than a maximum first conductivity type doping concentration in the transition region. A buried layer of second conductivity type is also provided. This buried layer extends diametrically opposite at least a portion of the transition region, forms a non-rectifying junction with the base region and has a higher second conductivity type doping concentration therein relative to the base region.

Still further embodiments of the present invention include preferred methods of forming vertical power devices having a lateral MOSFETs therein, by forming a semiconductor substrate having a drift region of first conductivity type therein and a transition region of first conductivity type that extends between the drift region and a face of the substrate. The transition region preferably has a maximum doping concentration therein that is greater than about ten times a minimum doping concentration in the drift region. A base region of second conductivity type is then formed that extends through the transition region and into the drift region. A trench is also preferably formed in the substrate. In particular, a trench is formed that extends through the transition region and into the drift region and has a sidewall that is spaced from the base region by a portion of the transition region. An insulated electrode is then formed in the trench and a gate electrode is formed on the face. To define a lateral MOSFET, a step is performed to selectively implant dopants of first conductivity type into the semiconductor substrate and thereby define a source region in the base region and a channel region extension that extends from the base region into the transition region. The formation of the channel region extension eliminates the need to extend the gate electrode laterally over the transition region. A source contact is then provided that electrically connects the source region to the insulated electrode in the trench.

These above-described embodiments provide MOSFETs having highly linear transfer characteristics (e.g., $I_d$ v. $V_g$) that can be used effectively in linear power amplifiers and in power switching applications. By using a transition region that preferably becomes fully depleted prior to channel pinch-off, the channel can be operated in a linear mode and the drift region, which supports large voltages, can be operated in a velocity saturation mode.

DESCRIPTION OF PREFERRED EMBODIMENTS

Figure 1:
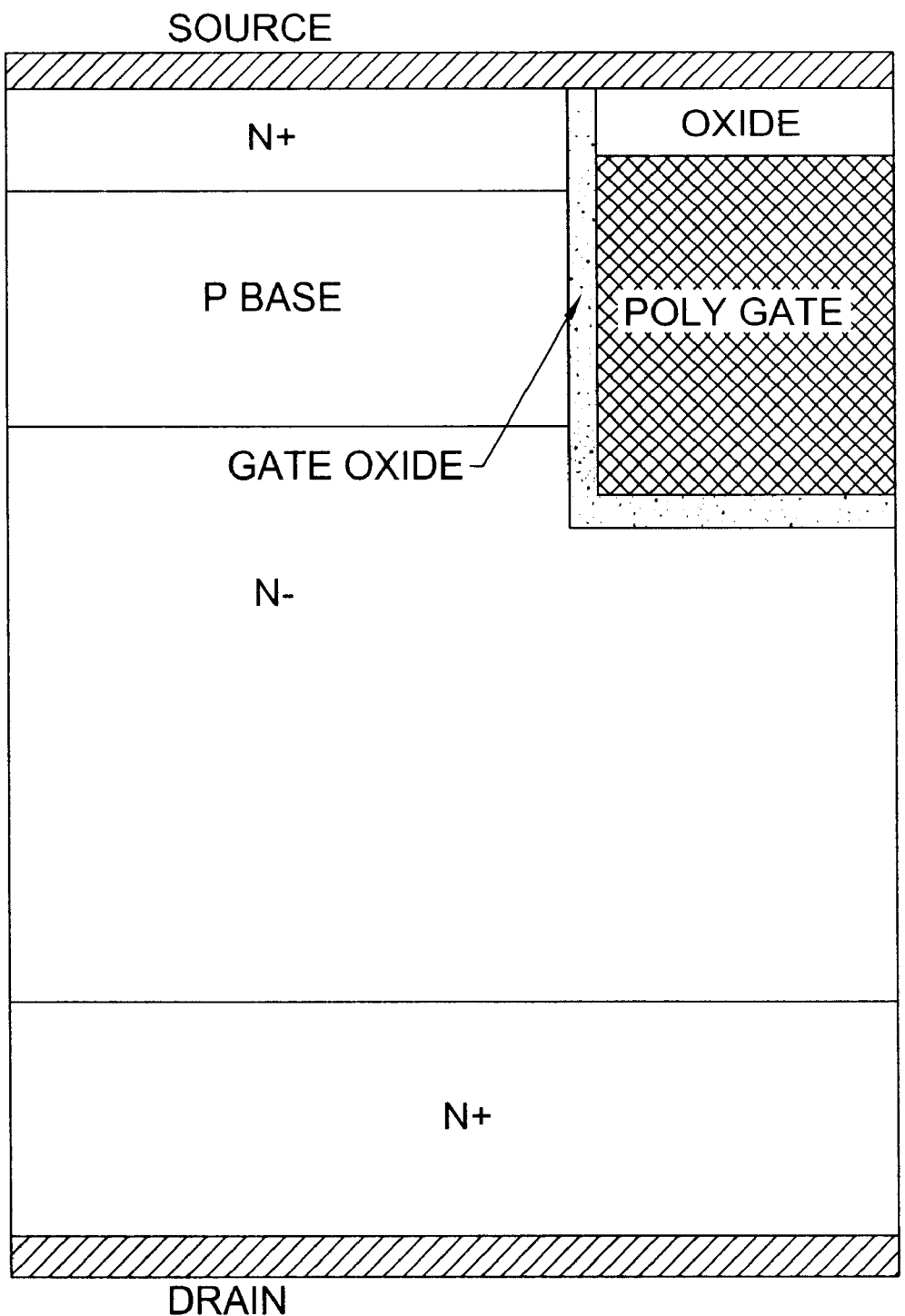
FIG. 1 is a cross-sectional view of a prior art UMOSFET.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Figure 3:
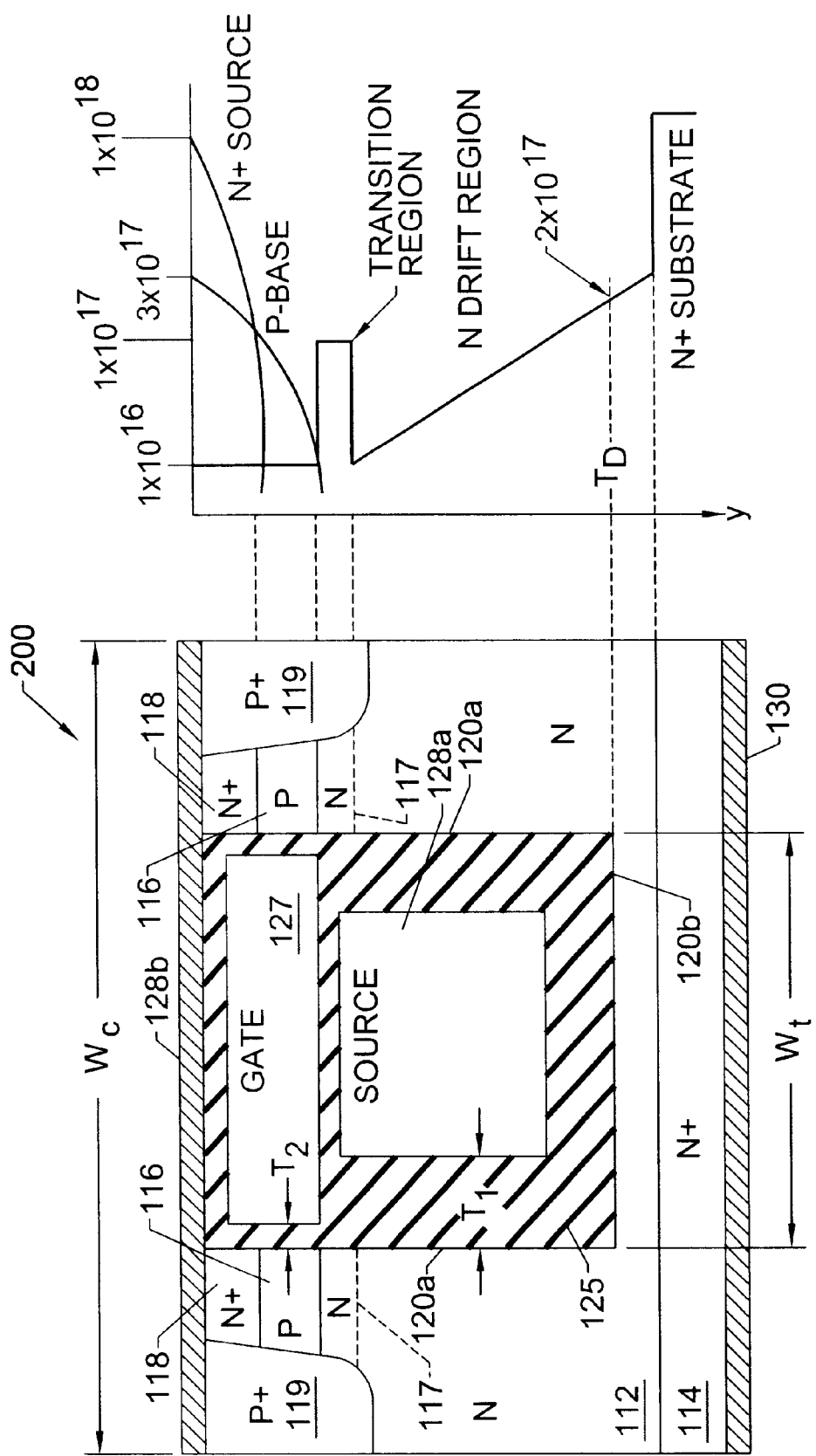
FIG. 3 is a cross-sectional view of a GD-UMOSFET and doping profile therein according to an embodiment of the present invention.

Referring now to FIG. 3, a UMOSFET according to a first embodiment of the present invention will be described. In particular, a unit cell 200 of an integrated UMOSFET has a predetermined width "$W_c$" (e.g., 1 µm) and comprises a highly doped drain contact layer 114 of first conductivity type (e.g., N+), a drift layer 112 of first conductivity type having a linearly graded doping profile therein and a transition region 117 of first conductivity type which may have a relatively high N-type doping concentration therein of about $1 \times 10^{17}$ cm$^{-3}$. As illustrated, the transition region 117 forms a non-rectifying junction with the drift layer 112 and the N-type doping concentration in the transition region 117 is higher than the N-type doping concentration in a portion of the N-type drift layer 112 that extends to the non-rectifying junction with the transition region 117.

A relatively thin base layer 116 of second conductivity type (e.g., P-type) is also provided on the transition region 117 and forms a P-N rectifying junction therewith. This base layer 116 may have a thickness of about 0.2 µm. A highly doped source layer 118 of first conductivity type (e.g., N+) is also provided on the base layer 116, as illustrated. A source electrode 128b and drain electrode 130 may also be provided at the first and second faces, in ohmic contact with the source layer 118 and the drain contact layer 114, respectively. The source electrode 128b also preferably forms an ohmic contact with a P+ base region extension 119 that extends through the transition region 117. The relatively highly doped transition region 117 is provided between the base layer 116 and the drift layer 112 in order to improve performance by enabling an inversion-layer channel formed in the base layer 116 to be operated in a linear mode (without channel pinch-off or velocity saturation) while the drift region is simultaneously operated in a velocity saturation mode.

The doping concentration in the transition region 117 is preferably set at a level sufficient to enable forward on-state conduction through the inversion-layer channel at low drain voltages and to maintain the channel in a linear mode of operation as the drain voltage is increased and exceeds the magnitude of a voltage applied to a gate electrode 127. This linear mode of operation is frequently referred to as a triode mode of operation. The design of the UMOSFET is such that the transition region 117 preferably becomes fully depleted at a point when the voltage at the drain-side of the channel $V_{cd}$ (i.e., at the end adjacent the transition region 117) is $0 \leq V_{cd} \leq V_{gs}$, where $V_{gs}$ designates the gate-to-source voltage. For example, the UMOSFET may be designed so that the transition region 117 becomes fully depleted when $0.2 \leq V_{cd} \leq 0.5$ Volts and $V_{gs}$=4.0 Volts. To achieve full depletion, the P+ base region extension 119 is provided in close proximity to the transition region 117 (i.e., in the center of each mesa in a multi-celled device having a plurality of side-by-side trenches therein). Accordingly, as the voltage in the channel increases, the transition region 117 becomes more and more depleted until the transition region 117 is pinched off in manner similar to conventional operation of a JFET.

The drift layer 112 and transition region 117 may be formed by epitaxially growing an N-type in-situ doped monocrystalline silicon layer having a thickness of about 4 μm on an N-type drain contact layer 114 (e.g., N+ substrate) having a thickness of 100 μm and a first conductivity type doping concentration of greater than about $1 \times 10^{18}$ cm$^{-3}$ (e.g. $1 \times 10^{19}$ cm$^{-3}$) therein. As illustrated, the drift layer 112 may have a linearly graded doping profile therein with a maximum concentration of greater than about $5 \times 10^{16}$ cm$^{-3}$ (e.g., $3 \times 10^{17}$ cm$^{-3}$) at the N+/N non-rectifying junction with the drain contact layer 114 and a minimum concentration of about $1 \times 10^{16}$ cm$^{-3}$ at the junction with the transition region 117. The base layer 116 may be formed by implanting P-type dopants such as boron into the drift layer 112 at an energy of 100 kEV and at a dose level of $1 \times 10^{14}$ cm$^{-2}$, for example. The P-type dopants may then be diffused to a depth of 0.8 μm into the drift layer 112. An N-type dopant such as arsenic may then be implanted at an energy of 50 kEV and at dose level of $1 \times 10^{15}$ cm$^{-2}$. The N-type and P-type dopants are then diffused simultaneously to a depth of 0.5 μm and 1.0 μm, respectively. The second conductivity type (e.g., P-type) doping concentration in the base layer 116 is also preferably greater than about $5 \times 10^{16}$ cm$^{-3}$ at the P-N junction with the source layer 118 (i.e., first P-N junction). A selective implanting step may also be performed at a relatively high dose and high energy level to define the P+ base region extension 119.

Figure 2:
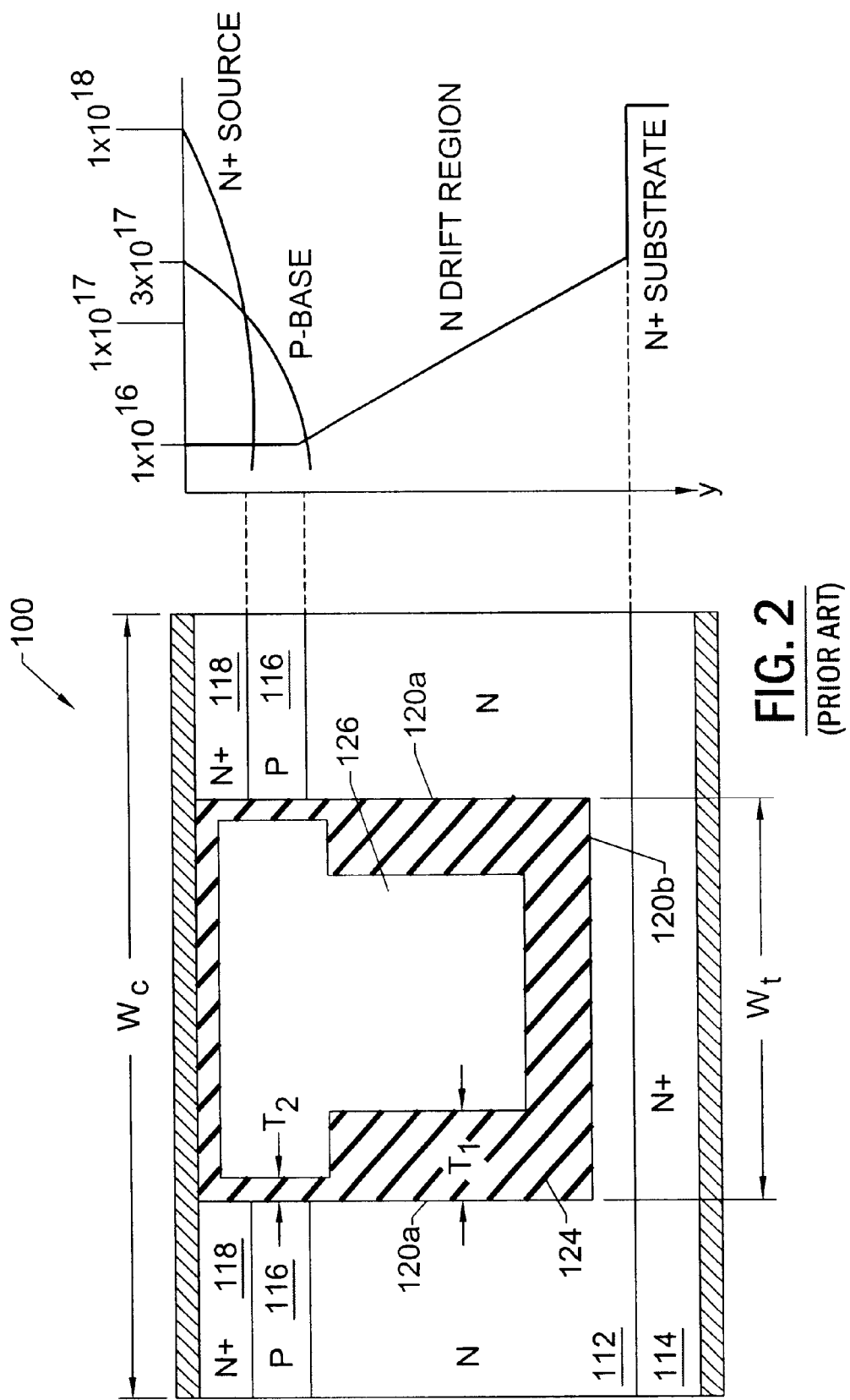
FIG. 2 is a cross-sectional view of another prior art UMOSFET and doping profile therein.

A stripe-shaped trench having a pair of opposing sidewalls 120a which extend in a third dimension (not shown) and a bottom 120b is then formed in the substrate. For a unit cell 100 having a width $W_c$ of 1 μm, the trench is preferably formed to have a width "$W_t$" of 0.5 μm at the end of processing. A gate electrode/source electrode insulating region a gate electrode 127 (e.g., polysilicon) and a trench-based source electrode 128a (e.g., polysilicon) are also formed in the trench. Because the gate electrode 127 is made relatively small and does not occupy the entire trench, the amount of gate charge required to drive the unit cell 200 during switching is much smaller than the amount of gate charge required to drive the unit cell 100 of FIG. 2 (assuming all other parameters and dimensions are equal).

Here, the trench-based source electrode 128a is electrically connected to the source electrode 128b in a third dimension (not shown). The portion of the gate electrode/source electrode insulating region 125 extending adjacent the trench bottom 120b and the drift layer 112 may also have a thickness "$T_1$" in a range between about 1500 Å and 5000 Å, for example, to inhibit the occurrence of high electric field crowding at the bottom corners of the trench and to provide a substantially uniform potential gradient along the trench sidewalls 120a. However, the portion of the gate electrode/source electrode insulating region 125 extending opposite the base layer 116 and the source layer 118 preferably has a thickness "$T_2$" of less than about 750 Å, and more preferably about 250 Å to maintain the threshold voltage of the device at about 2–3 volts.

Simulations of the device of FIG. 3 were also performed for a unit cell having a half-cell pitch of 1 μm with a half-mesa width of 0.5 μm. The thickness $T_2$ was set to 250 Å and the thickness of the base layer 116 was set to 0.2 μm with a peak doping concentration of $2 \times 10^{17}$ cm$^{-3}$. The gate electrode 127 extended to a depth of 0.6 μm and the trench depth was set to 4.7 μm. The thickness $T_1$ was also set to 3000 Å. The doping concentrations in the transition region 117 and drift layer 112 follow the profile illustrated by FIG. 3. Based on these characteristics, excellent current saturation characteristics were observed with uniform spacing between the $I_d$ v. $V_d$ curves (at gate biases ranging from 2 to 4 volts). Highly linear $I_d$ v. $V_g$ transfer characteristics for gate biases in the range from 2 to 4 volts were also observed.

Figure 4:
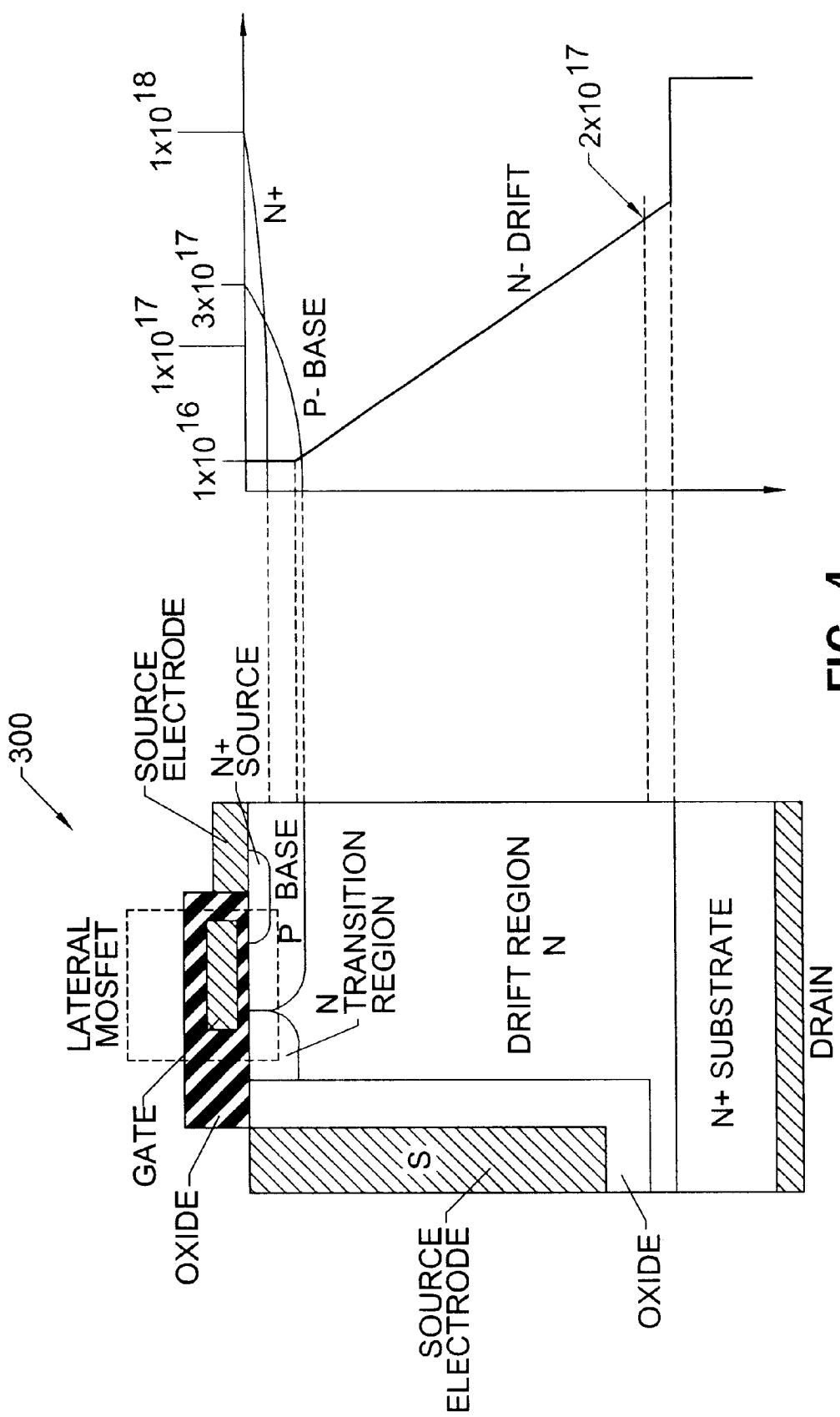
FIG. 4 is a cross-sectional view of a vertical device comprising a lateral MOSFET and doping profile therein according to an embodiment of the present invention.

Referring now to FIG. 4, a preferred vertical device 300 having a lateral MOSFET region therein according to a second embodiment of the present invention will be described. As illustrated, the preferred device 300 includes a lateral MOSFET on a face of a semiconductor substrate. The source, channel and drain regions of the lateral MOSFET are formed by an N+ source region, a P-type base region and an N-type transition region. The N-type transition region and the P-type base region are provided in an N-type drift region having a graded doping profile therein. The vertical doping profile of the source, base and drift regions are illustrated by the right hand side of FIG. 4. A trench is also provided in the substrate, as illustrated. This trench is preferably lined with an electrically insulating layer (e.g., oxide) and filled with a source electrode. The transition region, which may be doped to a relatively high level of $1 \times 10^{17}$ cm$^{-3}$ relative to an upper portion of the drift region, extends from a sidewall of the trench to the P-type base region. The transition region forms a non-rectifying junction with the drift region and forms a P-N rectifying junction with the base region. As will be understood by those skilled in the art, the application of a sufficiently positive gate bias to the gate electrode of the lateral MOSFET will induce the formation of an inversion-layer channel in a portion of the base region extending immediately underneath the gate electrode. This inversion-layer channel will electrically connect the source region to the transition region during forward on-state operation when the drain contact is biased positive relative to the source contact. The gate electrode may also be patterned to extend relatively close to the sidewall of the trench in order to provide sufficient electrical connection between the channel and the transition region (by countering the effects of the built-in depletion region at the P-N junction between the transition region and base region).

According to a preferred aspect of this embodiment, the drift region forms a non-rectifying junction with the transition region at a location where a first conductivity type doping concentration in the drift region is less than a first conductivity type doping concentration in the transition region. In particular, a maximum first conductivity type doping concentration in the transition region is preferably greater than about ten times a first conductivity type doping concentration in the drift region at the location of the non-rectifying junction. As illustrated, this non-rectifying junction extends from the sidewall of the trench to the P-type base region. The design of the device 300 is such that the transition region becomes fully depleted at a point before the voltage in the channel (at the transition region side) equals the gate voltage and, more preferably, at a point when the voltage in the channel is only a small fraction of the gate voltage. To achieve full depletion, the P-type base region is doped at a sufficiently high level (and has sufficient depth) so that the depletion region formed at the P-N junction between the transition region and the P-type base region extends primarily on the side of the transition region when the P-N junction becomes reverse biased. Accordingly, as the voltage in the channel increases, the transition region becomes increasingly depleted until the transition region is pinched off.

Simulations of the device of FIG. 4 were also performed for a lateral MOSFET having a channel length of 0.2 μm and the vertical doping profile illustrated by FIG. 4. The N-type doping concentration in the transition region was also set to $1 \times 10^{17}$ cm$^{-3}$ and the doping concentration in the drift region was $1 \times 10^{16}$ cm$^{-3}$ at the non-rectifying junction with the transition region. Based on these characteristics, excellent current saturation characteristics were observed with uniform spacing between the $I_d$ v. $V_d$ curves (at gate biases ranging from 2 to 3 volts). Highly linear $I_d$ v. $V_g$ transfer characteristics for gate biases in the range from 2 to 3 volts were also observed.

Figure 5A:
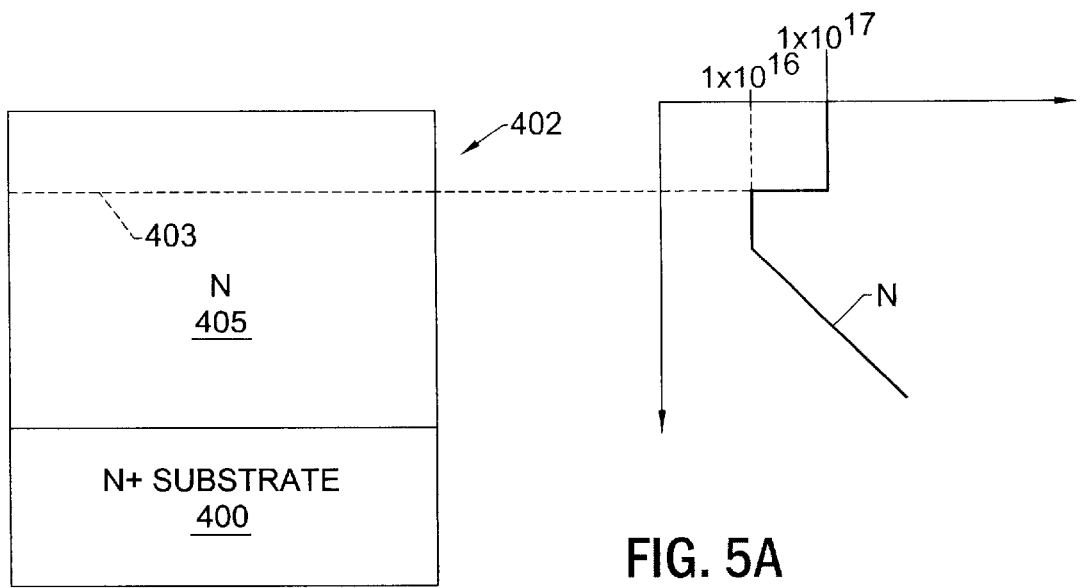
FIGS. 5A–5G are cross-sectional view of intermediate structures that illustrate preferred methods of forming a device according to an embodiment of the present invention.
Figure 5B:
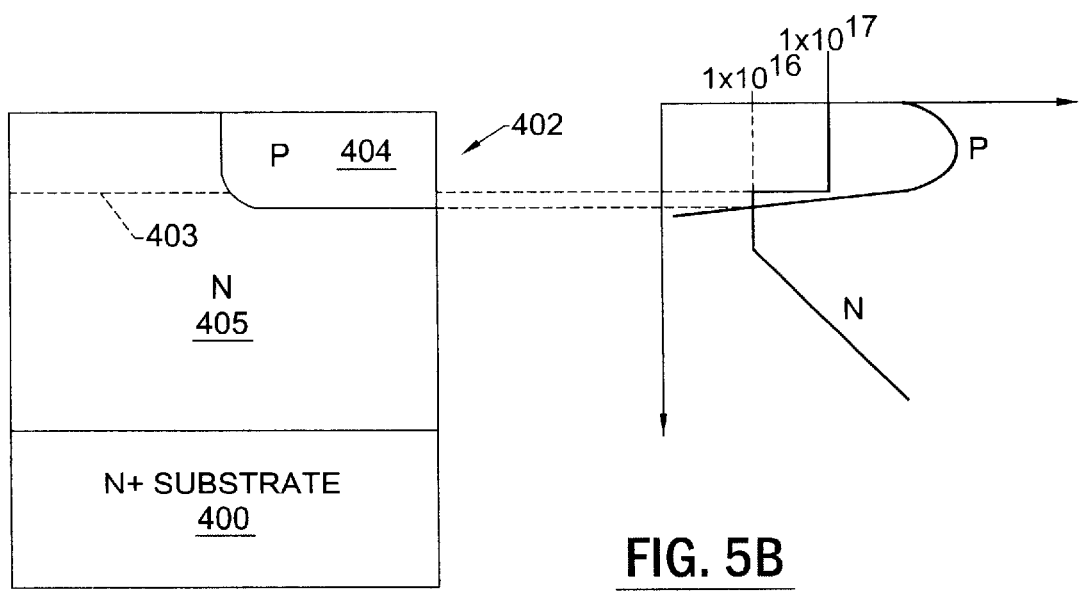

Referring now to FIGS. 5A–5G, preferred methods of forming a preferred vertical device having a lateral MOSFET therein will be described. In particular, FIG. 5A illustrates the steps of growing an N-type in-situ doped epitaxial layer 402 on a highly doped semiconductor substrate layer 400 (e.g., drain contact layer). As illustrated by the right hand side of FIG. 5A, the epitaxial layer 402 includes a drift region 405 having a graded doping profile therein and an N-type transition region 403 on the drift region 405. As illustrated, the N-type transition region 403 extends to an upper surface of the epitaxial layer 402 and may be doped to a level of about $1 \times 10^{17}$ cm$^{-3}$. A minimum doping concentration in the drift region 405 may also be set to a level of about $1 \times 10^{16}$ cm$^{-3}$. Referring now to FIG. 5B, a first mask (not shown) may be used during the step of selectively implanting P-type base region dopants into the epitaxial layer 402. An annealing step may then be performed to partially drive in the implanted P-type base region dopants and define a base region 404. As illustrated, the P-type base region 404 may be considerably more highly doped than the transition region 403 and may extend deeper into the epitaxial layer 402 than the transition region 403. The base region 404 may also have a relatively high peak doping concentration which is spaced from the surface of the epitaxial layer 402. In particular, the doping concentration at the surface of the base region 404 may be lower than the peak in order to establish a desired threshold voltage and the peak value may be established at a value that provides sufficient depletion to the transition region 403 during on-state operation.

Figure 5C:
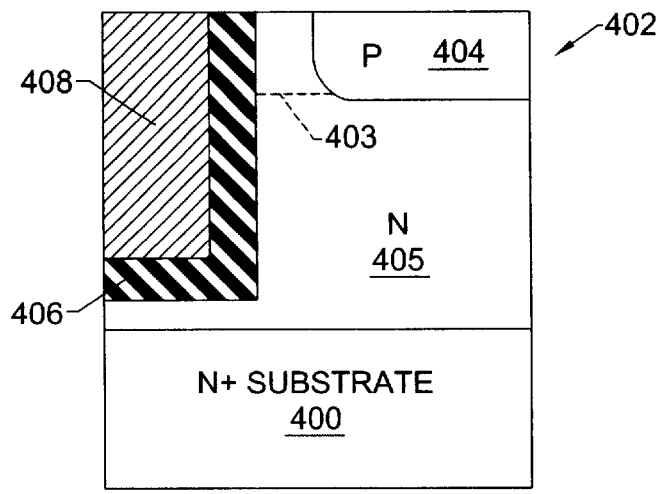
Figure 5D:
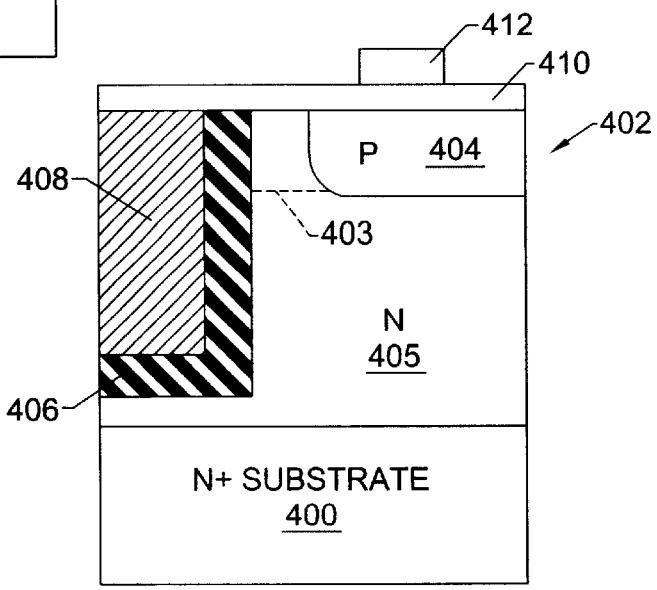

As illustrated by FIG. 5C, a trench is then formed in the epitaxial layer 402, using conventional photolithographically defined etching steps. The sidewalls and bottom of the trench are then lined with an electrically insulating layer 406. The spacing between a sidewall of the trench and the base region 404 is designed so that notwithstanding the relatively high doping concentration in the transition region 403, the transition region 403 can become fully depleted once a sufficient reverse bias is established across the P-N junction between the transition region 403 and the base region 404. For example, a conformal oxide deposition step may be performed to define an oxide insulating layer on the surface of the epitaxial layer 402 and in the trench. The trench may then be refilled with a doped polysilicon region 408, for example. A conventional planarization step may then be performed to planarize the doped polysilicon region 408 and the electrically insulating layer 406, and expose the surface of the epitaxial layer 402. Referring now to FIG. 5D, conventional steps may then be performed to grow or deposit a gate oxide layer 410 on the surface and on the polysilicon region 408. A layer of doped polysilicon may then deposited on the gate oxide layer 410. This layer may then be patterned using conventional techniques to define a gate electrode 412 which extends opposite the base region 404.

Figure 5E:
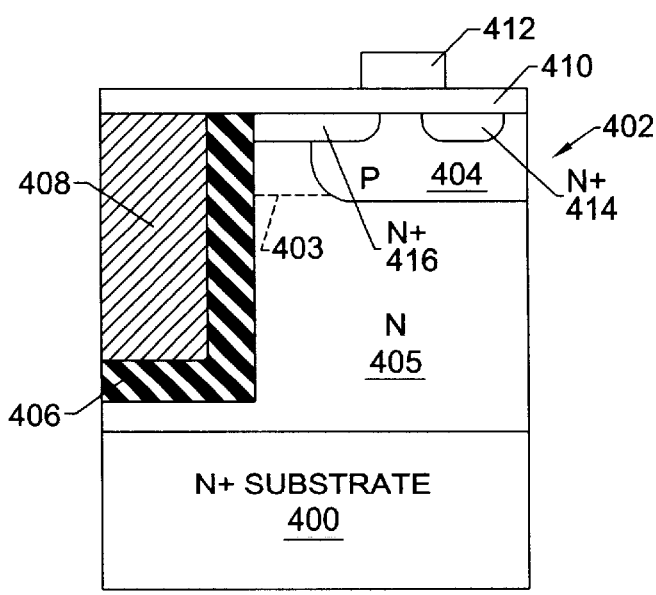
Figure 5F:
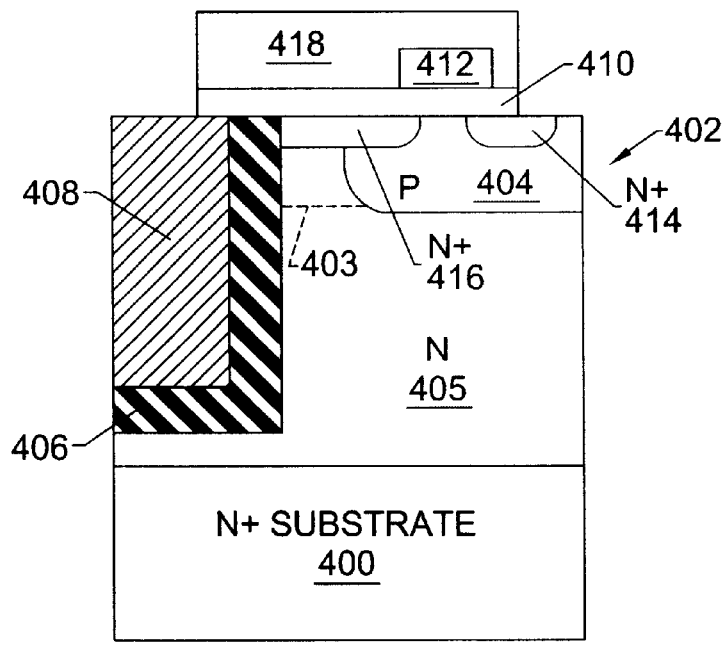
Figure 5G:
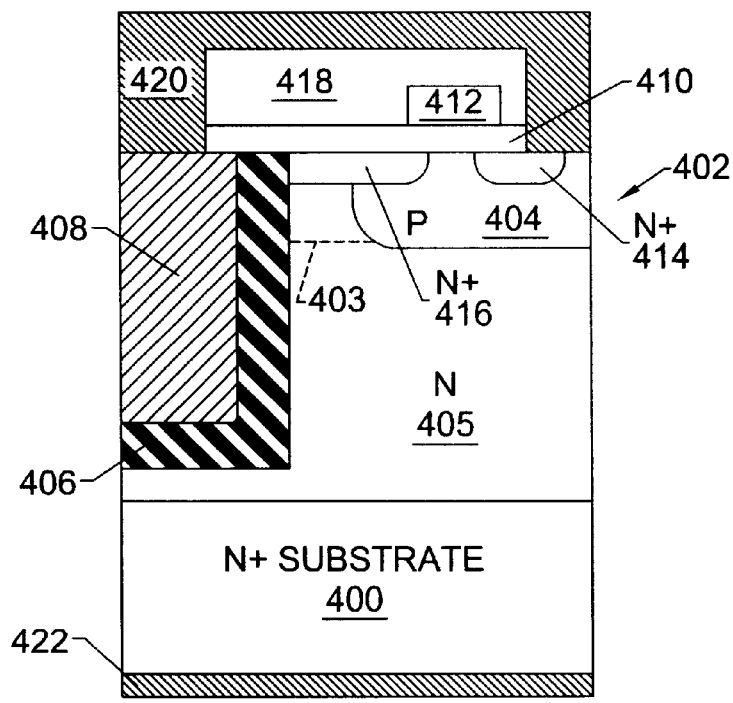

Referring now to FIG. 5E, a source region 414 and a channel region extension 416 may then be formed by implanting N-type dopants at a high dose level into the epitaxial layer 402, using the gate electrode 412 and another patterned photoresist layer (not shown) as an implant mask. The channel region extension 416 is preferably designed to improve the electrical connection between an inversion-layer channel in the base region 404 during forward on-state operation and eliminate the additional gate capacitance associated with extending the gate electrode laterally over the N-type transition region 403. An annealing step may then be performed to drive-in the implanted N-type dopants and further drive-in the P-type dopants in the base region 404. As illustrated by FIG. 5F, a blanket layer of a relatively thick passivation oxide 418 may be deposited and patterned to define contact windows therein. Then, as illustrated by FIG. 5G, a layer of metallization may be deposited and then patterned to define a source electrode 420. Similarly, a layer of metallization may be deposited on the backside of the substrate as a drain electrode 422.

Figure 6:
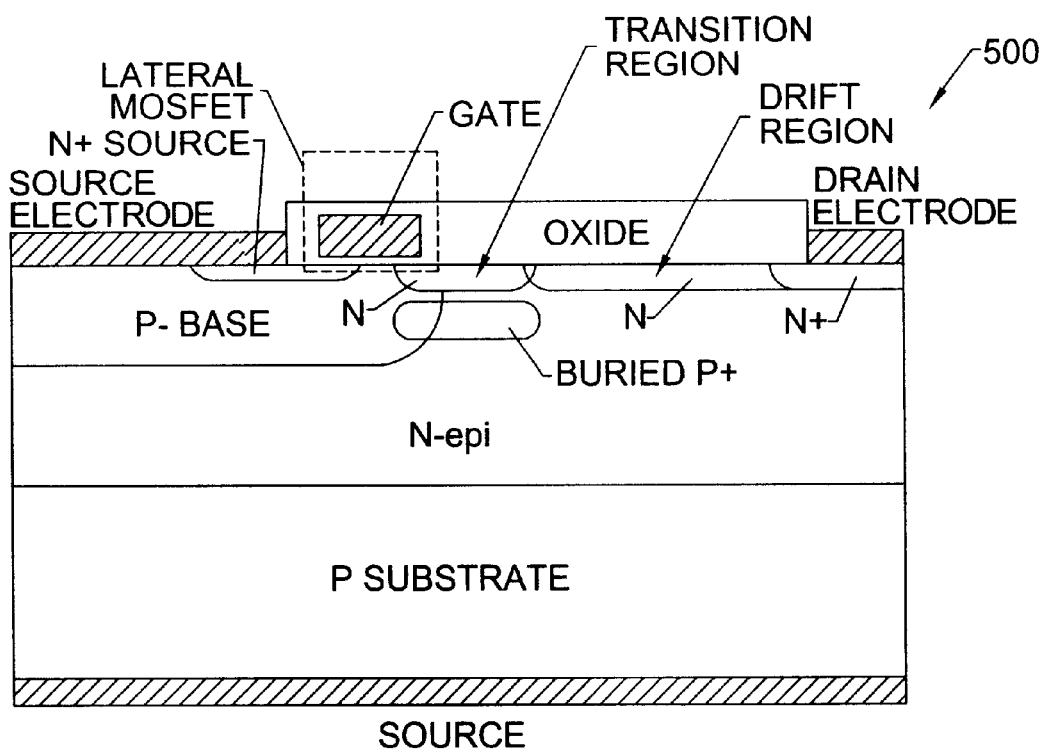
FIG. 6 is a cross-sectional view of a lateral MOSFET according to an embodiment of the present invention.

Referring now to FIG. 6, a preferred lateral MOSFET (e.g., LDMOS) comprises a P-type base region that may be formed in an N-type epitaxial layer. The N-type epitaxial layer may be formed on a P-type substrate, as illustrated, using conventional techniques. A gate oxide insulating layer and a gate electrode are also preferably provided on a surface of the N-type epitaxial layer. As illustrated, the gate electrode extends opposite the P-type base region. A selective implanting step may then be performed to define an N+ source region in the base region, using the gate electrode as an implant mask, and define an N+ drain contact region. Another selective implanting step may also be performed to define an N-type transition region which extends in the P-type base region and the N-type epitaxial layer, as illustrated. This implanting step may be performed at a dose sufficient to provide a transition region with a doping concentration of about $1 \times 10^{17}$ cm$^{-3}$ therein. The same implant mask used to define the transition region may also be used as an implant mask during the step of implanting P-type dopants into the base region and epitaxial layer. This latter selective implant step may be performed at a respective dose level and energy level sufficient to define a buried P+ layer which is aligned with the transition region. As illustrated, this buried P+ layer forms a non-rectifying junction with the P-base region and is electrically connected by the P-base region to a source electrode. A selective implant step may also be performed to define a lateral N-type drift region that electrically connects the transition region to the drain contact region. In particular, the N-type drift region preferably forms a non-rectifying junction with the transition region at a point where the N-type doping concentration in the transition region is about ten times greater than the N-type doping concentration in the drift region. Conventional techniques may also be performed to define a drift region having a lateral doping profile that increases in a direction from the transition region to the drain region. To provide coupling between the source contact and the drift region, the source contact may be patterned to extend over the drift region, as illustrated.

Figure 7B:
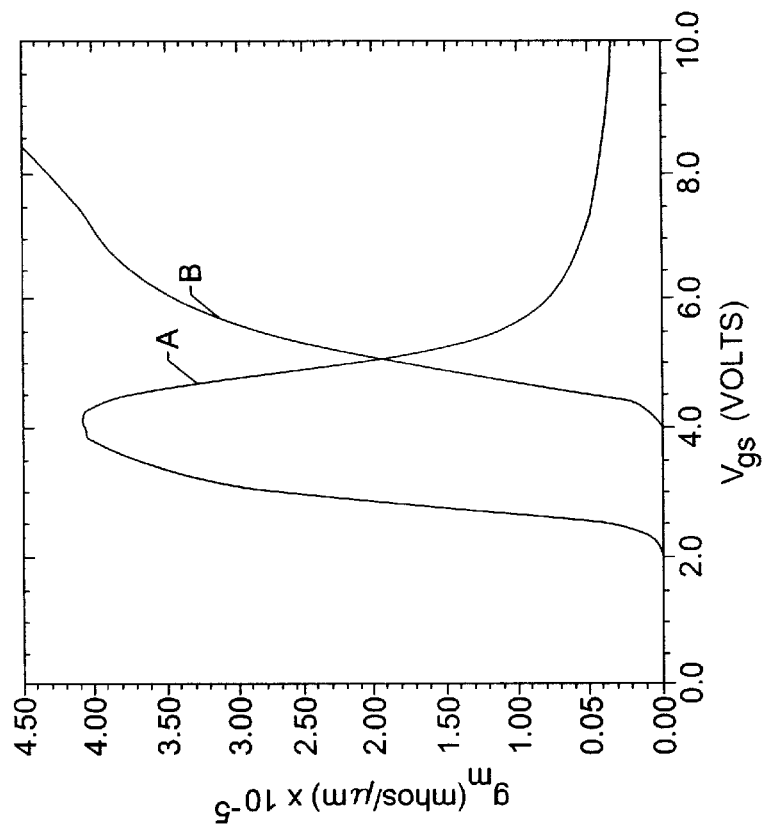
FIG. 7B is a graph of transconductance versus gate voltage corresponding to the transfer curves of FIG. 7A.
Figure 7A:
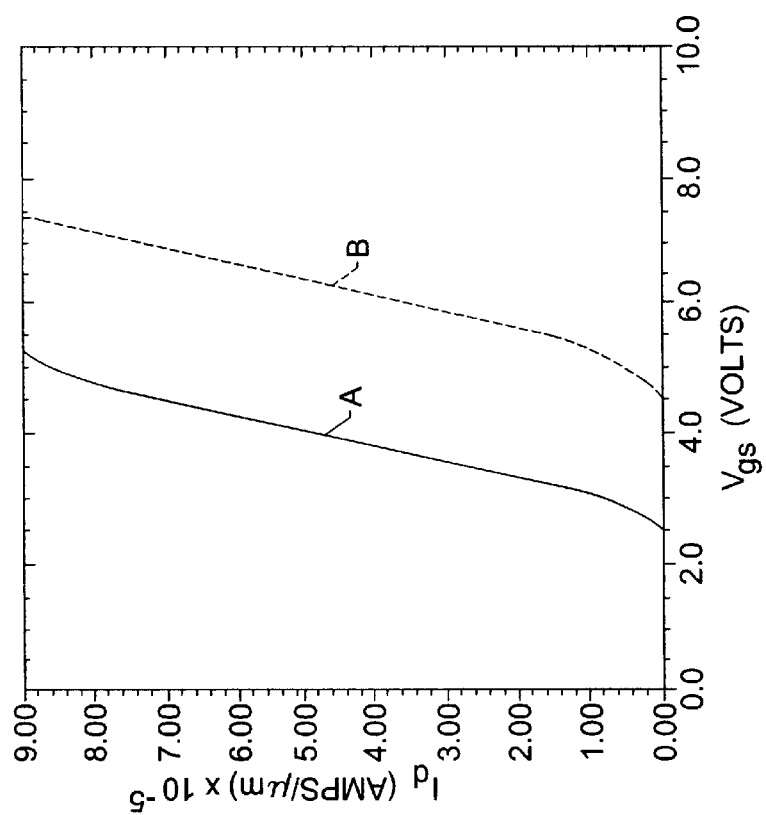
FIG. 7A is a graph illustrating transfer curves which may be achieved when the device of FIG. 6 is designed with the transition region and buried P+ layer (curve A) and without the transition region and buried layer (curve B).

Transfer curves and graphs of transconductance as a function of gate voltage are provided by FIGS. 7A–7B. In particular, FIG. 7A illustrates exemplary transfer curves associated with the device of FIG. 6, with the transition region and buried P+ layer (curve A) and without the transition region and buried P+ layer (curve B). As illustrated by curve A relative to curve B in FIG. 7A, a more linear transfer characteristic can be obtained using the combination of the transition region and the P+ buried layer which can be designed to fully deplete the transition region when $V_{cd}$=0.2 volts, for example. The fact that curve A of FIG. 7A yields a more linear transfer characteristic than curve B can best be illustrated by the transconductance curves of FIG. 7B. In particular, curve A of FIG. 7B has a flat transconductance ($g_m \approx 4 \times 10^{-5}$ mhos/micron) at about 4 volts. If the gate voltage swing is 0.5 volts at the point where the tranconductance is flat, a 1% variation in $g_m$ may be achieved. In contrast, at a $g_m \approx 4 \times 10^{-5}$ mhos/micron and voltage of about 7 Volts, curve B demonstrates a 7.5% variation in $g_m$ when the transition region and buried P+ layer are not used. Thus, the device of FIG. 6 can be expected to have a much greater dynamic range.

Figure 8:
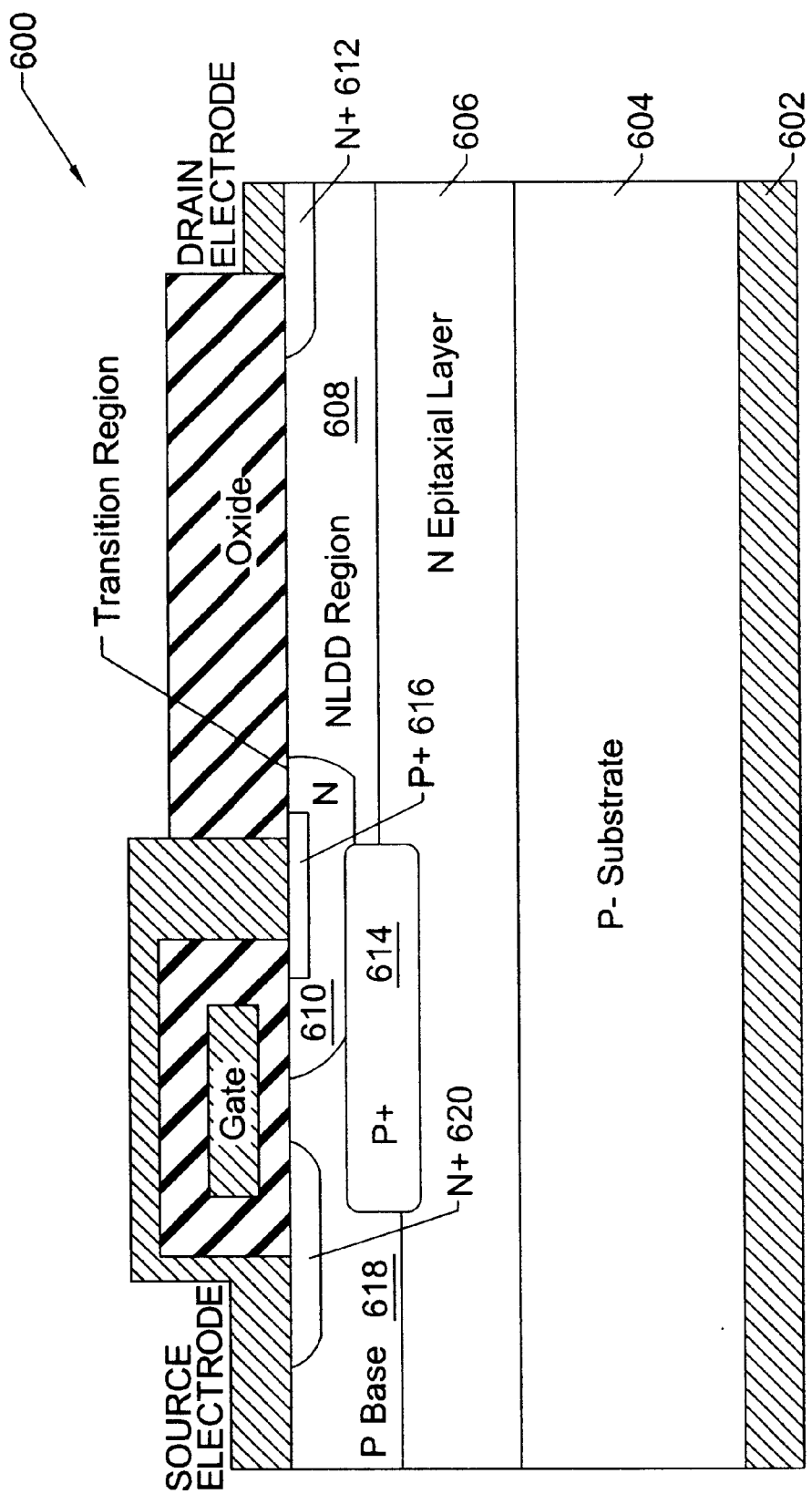
FIG. 8 is a cross-sectional view of a lateral MOSFET device according to an embodiment of the present invention.

Referring now to FIG. 8, a cross-sectional view of another preferred lateral MOSFET device 600 will be described. The device 600 comprises an epitaxial layer 606 of first conductivity type (e.g., N-type) on a semiconductor substrate layer 604 of second conductivity type (e.g., P-type). A substrate contact 602 is also provided on a second face of the composite semiconductor substrate. A base region 618 of second conductivity type is provided in the epitaxial layer 606, as illustrated. A composite drain region of first conductivity type is also provided in the epitaxial layer 606. The composite drain region comprises an transition region 610 (shown as N-type), a drift region 608 (shown as an N-type LDD region) and a drain contract region (shown as N+). A drain contact (DRAIN) may also be provided on the drain contact region, as illustrated. The drift region 608 may have a uniform first conductivity type doping concentration therein that is less than a first conductivity type doping concentration in the transition region 610. Alternatively, the drift region 608 may have a laterally graded doping profile therein that increases in a direction extending from the transition region 610 to the drain contact region 612. The transition region 610 may be doped to a level of about $2 \times 10^{17}$ cm$^{-3}$ and a portion of the drift region 608 extending closely adjacent the transition region 610 may be doped to a level of about $1 \times 10^{16}$ cm$^{-3}$. The lateral MOSFET device 600 also preferably includes a source region 620 which extends within the base region 618. As will be understood by those skilled in the art, the application of a gate bias of sufficient magnitude to the gate electrode (GATE) will induce formation of an inversion-layer channel in the base region 618. This inversion-layer channel will electrically connect the source region 620 to the transition region 610. According to a preferred aspect of this embodiment of the present invention, during on-state operation, the channel can be maintained in a linear mode of operation with the maximum voltage in the channel being held at a level substantially below the magnitude of the gate bias. Moreover, first and second control regions 614 and 616 of second conductivity type (shown as P+) can be used as means for depleting the transition region 610 as the drain-to-source voltage is increased. As illustrated, both the first and second control regions 614 and 616 are electrically connected to the source contact (SOURCE). The second control region 616 is electrically connected to the source contact at the first face of the composite semiconductor substrate and the first control region 614 is electrically connected by the base region 618 to the source contact. The spacing between opposing sides of the first and second control regions 614 and 616 influences the level at which a positive drain-to-source voltage will completely pinch-off a portion of the transition region 610 extending between the opposing sides. The use of a second control region 616 in addition to the first control region 614 (which is similar to the P+ buried region of FIG. 6) enables the use of a more highly doped transition region 610. For example, relative to the transition region in the device of FIG. 6, the transition region 610 in the device of FIG. 8 may have twice the charge before it fully depletes at the same drain-to-source voltage. The ability to provide a high transition region charge increases the dynamic range ($V_{gate}$ swing) over which the transconductance is constant (see, e.g., curve A in 7B).

Figure 9:
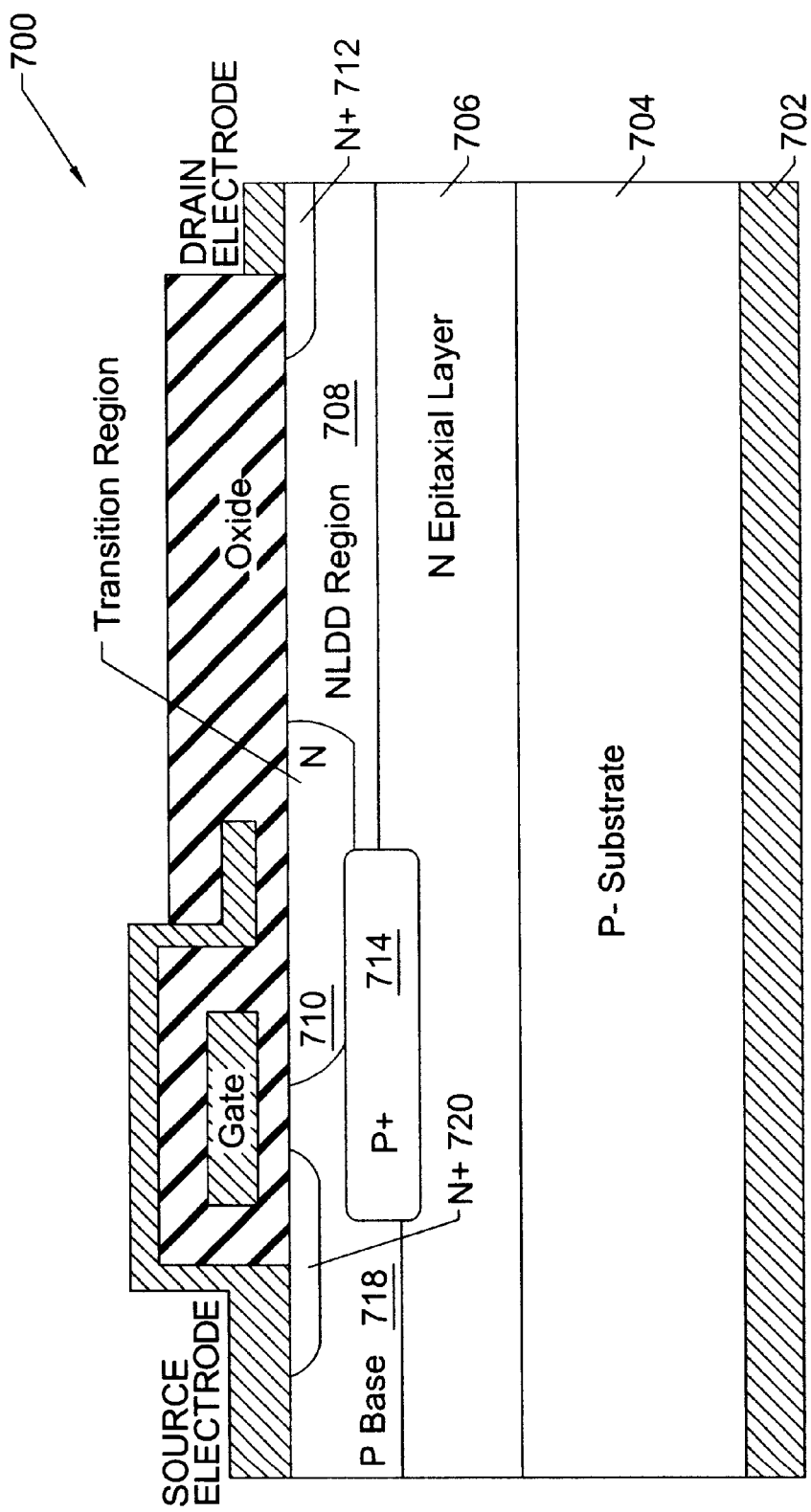
FIG. 9 is a cross-sectional view of a lateral MOSFET device according to an embodiment of the present invention.

Referring now to FIG. 9, a cross-sectional view of another preferred lateral MOSFET device 700 will be described. The device 700 comprises an epitaxial layer 706 of first conductivity type (e.g., N-type) on a semiconductor substrate layer 704 of second conductivity type (e.g., P-type). A substrate contact 702 is also provided on a second face of the composite semiconductor substrate. A base region 718 of second conductivity type is provided in the epitaxial layer 706, as illustrated. A composite drain region of first conductivity type is also provided in the epitaxial layer 706. The composite drain region comprises an transition region 710 (shown as N-type), a drift region 708 (shown as an N-type LDD region) and a drain contract region (shown as N+). A drain contact (DRAIN) may also be provided on the drain contact region, as illustrated. The drift region 708 may have a uniform first conductivity type doping concentration therein that is less than a first conductivity type doping concentration in the transition region 710. Alternatively, the drift region 708 may have a laterally graded doping profile therein that increases in a direction extending from the transition region 710 to the drain contact region 712. The transition region 710 may be doped to a level of about $2 \times 10^{17}$ cm$^{-3}$ and a portion of the drift region 708 extending closely adjacent the transition region 710 may be doped to a level of about $1 \times 10^{16}$ cm$^{-3}$. The lateral MOSFET device 700 also preferably includes a source region 720 which extends within the base region 718. As will be understood by those skilled in the art, the application of a gate bias of sufficient magnitude to the gate electrode (GATE) will induce formation of an inversion-layer channel in the base region 718. This inversion-layer channel will electrically connect the source region 720 to the transition region 710. A buried P+ region 714 is also provided for depleting the transition region 710 while the channel is operating in a linear mode. To increase the degree of depletion for a given drain-to-source bias, the source contact (SOURCE) is extended opposite the transition region 710 and is insulated and spaced therefrom by a relatively thin insulating layer (e.g., oxide layer). During on-state operation, the reverse bias established across the metal-insulator-semiconductor (MIS) junction between the source contact extension and the transition region 710 will and induce further depletion of the transition region 710.

Figure 10:
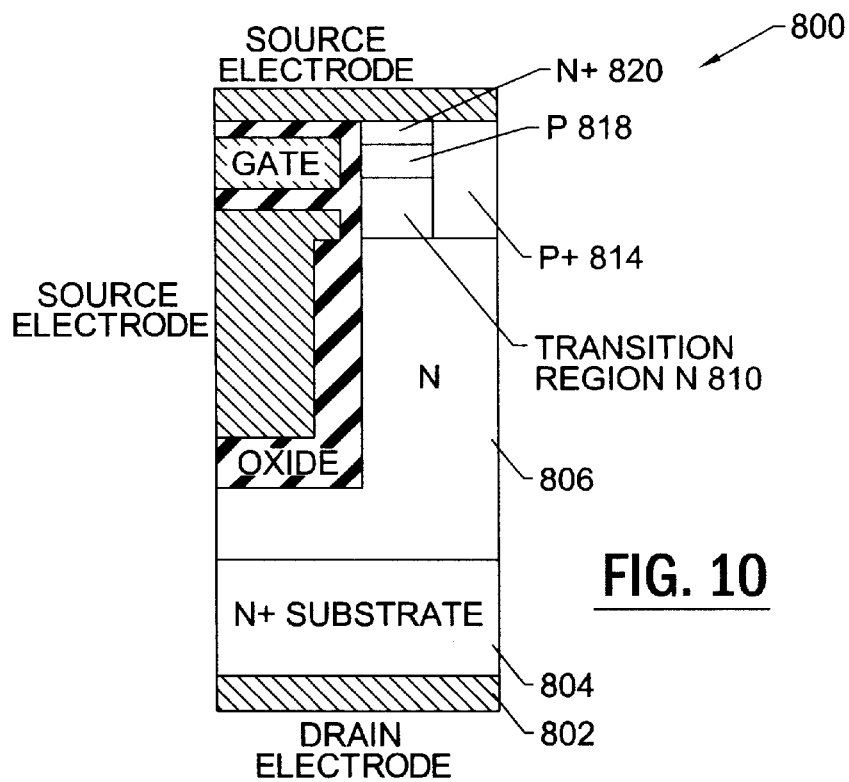
FIG. 10 is a cross-sectional view of a vertical MOSFET device according to an embodiment of the present invention.

Referring now to FIG. 10, another preferred UMOSFET device 800 will be described. This device 800 is similar to the device of FIG. 3, however, a portion of the trench oxide extending between the buried source electrode in the trench and the transition region 810 is thinned in order to increase the degree of coupling between the buried source electrode and the transition region 810 and thereby increase the rate at which the transition region 810 becomes depleted as the drain-to-source voltage is increased during forward on-state operation. As illustrated by FIG. 10, the UMOSFET device 800 includes an N+ substrate layer 804 (e.g., drain contact layer), a drain electrode 802 and a drift region 806 which may have a graded doping profile therein. A P-type base region 818 is also provided between the transition region 810 and a source region 820. A highly doped base region extension 814 is also provided, as illustrated. This base region extension 814 operates in combination with the buried source electrode in the trench to deplete the transition region 810 fully before the inversion-layer channel in the base region 818 becomes pinched off (i.e., before it exits the linear mode).

Figure 11:
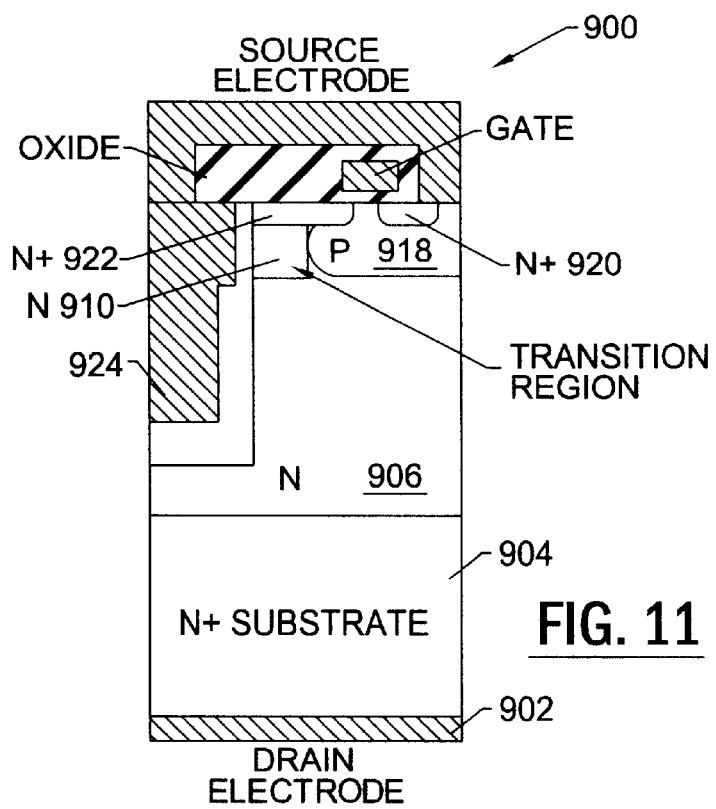
FIG. 11 is a cross-sectional view of a vertical device having a lateral MOSFET therein according to an embodiment of the present invention.

Referring now to FIG. 11, another preferred vertical device 900 having a lateral MOSFET therein will be described. This device 900 is similar to the device of FIG. 5G, however, a portion of the trench oxide extending between the source electrode 924 in the trench and the transition region 910 is thinned in order to increase the degree of coupling between the buried source electrode 924 and the transition region 910. As illustrated by FIG. 11, the device 900 includes an N+ substrate layer 904 (e.g., drain contact layer), a drain electrode 902 and a drift region 906 which may have a graded doping profile therein. A P-type base region 918 is also provided, as illustrated. A source region 920 and a channel region extension 922 (shown as N+) may also be provided. The source region and channel region extension 922 may be self-aligned to the gate electrode (GATE) using conventional CMOS fabrication techniques.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A vertical power device, comprising:
   an insulated-gate field effect transistor that utilizes an N-type transition region in a forward on-state current path extending between a source electrode and a drain electrode of the power device in combination with a P-type base region that forms a P-N rectifying junction with the N-type transition region and a trench-based source electrode that extends in a trench having a sidewall that defines an interface with a vertical first conductivity type drift region of the power device, as means for achieving a forward on-state mode of operation in the power device that simultaneously supports linear operation in an inversion-layer channel of the field effect transistor and velocity saturation operation in the drift region when the drain region is positively biased relative to a source region and the P-N rectifying junction is reversed biased to a point where the N-type transition region, which defines a non-rectifying junction with the N-type drift region, is fully depleted by the P-type base region and a maximum voltage at a drain-side of the inversion-layer channel is less than a gate voltage of the insulated-gate field effect transistor.

2. A vertical power device, comprising:
   a semiconductor substrate, said semiconductor substrate comprising an N+ substrate region and an N-type drift region that extends on said N+ substrate region and is more lightly doped than said N+ substrate region;
   a P-type base region that extends in said semiconductor substrate and defines a first P-N rectifying junction with the N-type drift region;
   an N-type transition region that extends in said semiconductor substrate and defines a non-rectifying junction with the N-type drift region and a second P-N rectifying junction with said P-type base region;
   an N+ source region that extends in said P-type base region and forms a third P-N rectifying junction with said P-type base region;
   an insulated gate electrode that extends on said semiconductor substrate and is positioned opposite said P-type base region so that application of a sufficiently positive gate voltage to said insulated gate electrode causes formation of an inversion-layer channel that extends in said P-type base region and electrically connects said N+ source region to said N-type transition region;
   a trench that extends in said semiconductor substrate and has a sidewall that defines an interface with the N-type drift region;
   an insulated source electrode in said trench;
   a source electrode that is electrically coupled to said N+ source region;
   a drain electrode that is electrically coupled to the N+ substrate region; and
   wherein said P-type base region is doped at a sufficiently high level and has a sufficient depth in said semiconductor substrate and a length of the inversion-layer channel is sufficiently short that a depletion region formed at the second P-N rectifying junction pinches off said N-type transition region at an operating point when the inversion-layer channel possesses linear behavior and the N-type drift region possesses velocity saturated behavior when a forward on-state current is present in the inversion-layer channel and the N-type drift region.

3. The power device of claim 2, wherein the second P-N rectifying junction pinches off said N-type transition region at a point when a maximum voltage at a drain-side of the inversion-layer channel is less than the positive gate voltage.

4. The power device of claim 3, wherein a maximum N-type doping concentration in said N-type transition region is greater than about ten times an N-type drift region doping concentration at the non-rectifying junction.

5. A vertical power device, comprising:
   a semiconductor substrate, said semiconductor substrate comprising an N+ substrate region and an N-type drift region that extends on said N+ substrate region and is more lightly doped than said N+ substrate region;

a P-type base region that extends in said semiconductor substrate and defines a first P-N rectifying junction with the N-type drift region;

an N-type transition region that extends in said semiconductor substrate and defines a non-rectifying junction with the N-type drift region and a second P-N rectifying junction with said P-type base region;

an N+ source region that extends in said P-type base region and forms a third P-N rectifying junction with said P-type base region;

an insulated gate electrode that extends on said semiconductor substrate and is positioned opposite said P-type base region so that application of a sufficiently positive gate voltage to said insulated gate electrode causes formation of an inversion-layer channel that extends in said P-type base region and electrically connects said N+ source region to said N-type transition region;

a source electrode that is electrically coupled to said N+ source region;

a drain electrode that is electrically coupled to the N+ substrate region; and means, comprising a trench-based insulated source electrode and P-type dopants in said P-type base region, for quickly depleting said N-type transition region in response to increases in a reverse bias across the second P-N rectifying junction so that when the N-type drift region switches from linear behavior to velocity saturated behavior the inversion-layer channel continues to sustain linear behavior and a maximum voltage at a drain side of the inversion layer channel is less than the positive gate voltage.

* * * * *